United States Patent
Yu et al.

(10) Patent No.: US 6,403,433 B1
(45) Date of Patent: Jun. 11, 2002

(54) SOURCE/DRAIN DOPING TECHNIQUE FOR ULTRA-THIN-BODY SOI MOS TRANSISTORS

(75) Inventors: Bin Yu, Santa Clara; Jonathan Kluth; Emi Ishida, both of Sunnyvale, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/397,217

(22) Filed: Sep. 16, 1999

(51) Int. Cl.[7] .......................................... H01L 21/336
(52) U.S. Cl. ...................... 438/300; 438/162; 438/166; 438/486; 438/528
(58) Field of Search ................... 438/300, 162, 438/166, 482, 486, 517, 528

(56) References Cited

U.S. PATENT DOCUMENTS

| | | | | |
|---|---|---|---|---|
| 4,532,695 A | * | 8/1985 | Schuermeyer | 438/285 |
| 4,683,645 A | | 8/1987 | Naguib et al. | 438/297 |
| 4,745,082 A | | 5/1988 | Kwok | 438/178 |
| 4,784,718 A | | 11/1988 | Mitani et al. | 438/183 |
| 4,789,644 A | * | 12/1988 | Meda | 438/300 |
| 5,264,382 A | | 11/1993 | Watanabe | 438/180 |
| 5,374,575 A | | 12/1994 | Kim et al. | 438/291 |
| 5,391,510 A | | 2/1995 | Hsu et al. | 438/301 |
| 5,393,685 A | | 2/1995 | Yoo et al. | 438/231 |
| 5,429,956 A | | 7/1995 | Shell et al. | 438/291 |
| 5,593,907 A | | 1/1997 | Anjum et al. | 438/298 |
| 5,607,884 A | | 3/1997 | Byun | 438/297 |
| 5,675,159 A | | 10/1997 | Oku et al. | 257/284 |
| 5,716,861 A | | 2/1998 | Moslehi | 438/231 |
| 5,793,090 A | | 8/1998 | Gardner et al. | 257/408 |
| 5,811,323 A | | 9/1998 | Miyasaka et al. | 438/151 |
| 5,825,066 A | | 10/1998 | Buynoski | 257/345 |
| 5,856,225 A | | 1/1999 | Lee et al. | 438/291 |
| 5,858,843 A | | 1/1999 | Doyle et al. | 438/299 |
| 6,150,221 A | * | 11/2000 | Aoyama | 438/300 |

FOREIGN PATENT DOCUMENTS

| | | |
|---|---|---|
| JP | 3-248433 | 11/1991 |
| JP | 4-123439 | 4/1992 |
| JP | 5-160396 | 6/1993 |

OTHER PUBLICATIONS

IEDM Technical Digest International Electronic Device Meeting 1997 Sub–100nm Gate Length Metal Gate.
NMOS Transistors Fabricated by a Replacement Gate Process by Chatterjee, et al.1997 IEEE.
"Sub 50–nm Fln FET: PMOS" Huang, et al., International Electron Devices Meeting Technical Digest, Washington DC, Dec. 1999, pp. 67–70.
"Ultra–Thin–Body Silicon–On–Insulator MOSFET's for Terabit–Scale Integration" Yu, et al., Proceedings of the International Semiconductor Device Research Symposium, Charlottesville, VA, Dec. 1997, pp. 623–626.
Wolf, S., "Silicon Processing in the VLSI Era", vol. 2, pp. 66–67, 72–73, 154–155, 157–158, 1990.*

* cited by examiner

*Primary Examiner*—Carl Whitehead, Jr.
*Assistant Examiner*—Christy Novacek
(74) *Attorney, Agent, or Firm*—Foley & Lardner

(57) ABSTRACT

An ultra-large-scale integrated (ULSI) circuit includes MOSFETs on an SOI substrate. The MOSFETs include elevated source and drain regions. The elevated source and drain regions are amorphized before doping. Neutral ion species can be utilized to amorphize the elevated source and drain region. Dopants are activated in a low-temperature rapid thermal anneal process.

15 Claims, 1 Drawing Sheet

SOURCE/DRAIN DOPING TECHNIQUE FOR ULTRA-THIN-BODY SOI MOS TRANSISTORS

CROSS REFERENCE TO RELATED APPLICATIONS

This patent application is related to U.S. application Ser. No. 09/187,630, filed on Nov. 6, 1998, by Yu entitled "Dual Amorphization Implant Process for Ultra-Shallow Drain and Source Extensions", U.S. application Ser. No. 09/187,890 filed on Nov. 6, 1998 by Yu, et al. entitled "A Method of Fabricating an Integrated Circuit with Ultra-Shallow Source/Drain Extensions", and U.S. application Ser. No. 09/187,172, filed on Nov. 6, 1998, by Yu entitled "Recessed Channel Structure for Manufacturing Shallow Source Drain Extension", and all assigned to the assignee of the present invention.

BACKGROUND OF THE INVENTION

The present invention relates to integrated circuits and methods of manufacturing integrated circuits. More particularly, the present invention relates to a method of manufacturing integrated circuits having transistors with ultrashallow source/drain extensions.

Currently, deep-submicron complementary metal oxide semiconductor (CMOS) is the primary technology for ultra-large scale integrated (ULSI) devices. Over the last two decades, reduction in the size of CMOS transistors has been a principal focus of the microelectronics industry. However, as the sizes of the various components of the transistor are reduced, operational parameters and performance characteristics can change. Appropriate transistor performance must be maintained as transistor size is decreased.

The ULSI circuit can include CMOS field effect transistors (FETS). The transistors can include semiconductor gates disposed between drain and source regions. The drain and source regions are typically heavily doped with a P-type dopant (boron) or an N-type dopant (phosphorous).

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and draininduced barrier-lowering. Shallow source and drain extensions and, hence, controlling short-channel effects, are particularly important as transistors become smaller.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or an ion implantation process. Without the sidewall spacers, the doping process introduces dopants into a thin region (i.e., just below the top surface of the substrate) to form the drain and source extensions as well as to partially form the drain and source regions.

After the drain and source extensions are formed, silicon dioxide spacers, which abut lateral sides of the gate structure, are provided over the source and drain extensions. The substrate is doped a second time to form the deeper source and drain regions. The source and drain extensions are not further doped due to the blocking capability of the silicon dioxide spacer.

As transistors disposed on integrated circuits (ICs) become smaller, transistors with shallow and ultra-shallow source/drain extensions have become more difficult to manufacture. For example, smaller transistors should have ultrashallow source and drain extensions with less than 30 nanometer (nm) junction depth. Forming source and drain extensions with junction depths of less than 30 nm is very difficult using conventional fabrication techniques. Conventional ion implantation and diffusion-doping techniques make transistors on the IC susceptible to short-channel effects, which result in a dopant profile tail distribution that extends deep into the substrate. Also, conventional ion implantation techniques have difficulty maintaining shallow source and drain extensions because point defects generated in the bulk semiconductor substrate during ion implantation can cause the dopant to more easily diffuse (transient enhanced diffusion, TED). The diffusion often extends the source and drain extension vertically into the bulk semiconductor substrate.

Transistors, such as, metal oxide semiconductor field effect transistors (MOSFETs), are generally either bulk semiconductor-type devices or silicon-on-insulator (SOI)-type devices. Most integrated circuits are fabricated in a CMOS process on a bulk semiconductor substrate.

In bulk semiconductor-type devices, transistors, such as, MOSFETs, are built on the top surface of a bulk substrate. The substrate is doped to form source and drain regions, and a conductive layer is provided between the source and drain regions. The conductive layer operates as a gate for the transistor; the gate controls current in a channel between the source and the drain regions. As transistors become smaller, the body thickness of the transistor (or thickness of depletion layer below the inversion channel) must be scaled down to achieve superior short-channel performance.

Conventional SOI-type devices include an insulative substrate attached to a thin-film semiconductor substrate that contains transistors similar to the MOSFETs described with respect to bulk semiconductor-type devices. The insulative substrate generally includes a buried insulative layer above a lower semiconductor base layer. The transistors on the insulative substrate have superior performance characteristics due to the thin-film nature of the semiconductor substrate and the insulative properties of the buried insulative layer. In a fully depleted (FD) MOSFET, the body thickness is so small that the depletion region has a limited vertical extension, thereby eliminating link effect and lowering hot carrier degradation. The superior performance of SOI devices is manifested in superior short-channel performance (i.e., resistance to process variation in small size transistor), near-ideal subthreshold voltage swing (i.e., good for low off-state current leakage), and high saturation current.

As the physical gate length of MOS transistors shrink to dimensions of 50 nm and below, ultra-thin-body MOSFETs fabricated on very thin SOI substrates provide significant architectural advantages. The body thickness of such devices can be below 200 Angstroms (Å) to overcome the short-channel effects (e.g., threshold voltage roll-off and drain induced barrier lowering) which tend to be severe in devices with small dimensions.

The source region and drain regions of such devices can be raised by selective silicon (SI) epitaxy to make connections to source and drain contacts less difficult. The raised source and drain region provide additional material for contact silicidation processes. However, the raised source and drain region do not necessarily make conventional doping processing for source and drain junctions less challenging especially with respect to transistors with small gate lengths. The spacing between the source and drain regions in devices with gate lengths below 70 nm is extremely narrow (e.g., only 25–30 nm).

According to conventional doping techniques, the dopant implanted into the source and drain region must be activated at temperatures of 900–1100° C. for several seconds. The high thermal budget associated with conventional doping techniques can produce significant thermal diffusion which can cause a short between the source and drain region. Shorting between the source and drain region is a particular problem at small gate lengths.

Thus, there is a need for an integrated circuit or electronic device that includes transistors not susceptible to shorts caused by dopant thermal diffusion. Further still, there is a need for an SOI circuit that has transistors with an abrupt lateral dopant gradient. Even further still, there is a need for source and drain regions having dopants activated in a low thermal budget process. Yet further still, there is a need for an SO integrated circuit with transistors having gate lengths of about 50 nm and below.

SUMMARY OF THE INVENTION

The present invention relates to a method of manufacturing an integrated circuit including a plurality of transistors. The plurality of transistors include a first transistor having a gate structure disposed on a film. The method includes forming an elevated source region and an elevated drain region on the substrate, amorphizing the elevated source region and the elevated drain region, and providing dopants to the elevated source region and the elevated drain region. The method also includes annealing the elevated source region and the elevated drain region to recrystallize the elevated source region and elevated drain region. The gate structure is between the elevated source region and the elevated drain region.

The present invention further relates to a semiconductor-on-insulator integrated circuit including a transistor. The transistor includes a gate disposed between an elevated source region and an elevated drain region. The elevated drain region and the elevated source region are amorphized, doped, and subjected to a low thermal budget process to crystallize the elevated source and drain region.

The present invention further relates to a method of manufacturing a ULSI circuit on a semiconductor-on-insulator substrate. The substrate includes a gate disposed on a semiconductor film. The method includes selectively depositing a semiconductor film to form a first structure at a first location and a second structure at a second location, providing neutral dopants to the first structure and the second structure, and doping the first structure and the second structure with non-neutral dopants. The gate is between the first location and the second location. The neutral dopants form amorphous regions in the first structure and the second structure.

BRIEF DESCRIPTION OF THE DRAWINGS

Exemplary embodiments will hereafter be described with reference to the accompanying drawings, wherein like numerals denote like elements, and.

DETAILED DESCRIPTION OF THE PREFERRED EMBODIMENTS

Figure 1:
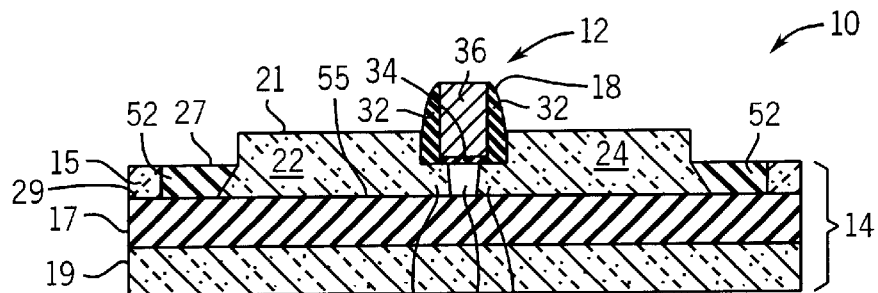
FIG. 1 is a cross-sectional view of a portion of an integrated circuit in accordance with an exemplary embodiment of the present invention, the integrated circuit includes a transistor provided on a semiconductor-on-insulator substrate.

With reference to FIG. 1, a transistor 12 is disposed on a semiconductor substrate 14, such as, a wafer. Semiconductor substrate 14 is preferably a semiconductor-on-insulator (SOI) substrate. Preferably, substrate 14 includes a thin film semiconductor layer 15, an insulative layer 17, and a semiconductive base layer 19. Alternatively, layer 15 can be disposed solely on an insulative layer 17.

Layer 17 is preferably a buried oxide layer provided upon a base layer 19 of silicon. Layer 17 is preferably silicon dioxide and has a thickness of 1000–5000 Å. Layer 17 is formed by oxygen implantation. Layer 15 is preferably a layer of silicon having a thickness of 150–200 Å.

Transistor 12 is part of a portion 10 of an integrated circuit (IC) manufactured on a wafer (such as, a silicon wafer). Transistor 12 includes a gate structure 18, an elevated source region 22, and an elevated drain region 24. Regions 22 and 24 extend from a top surface 21 (above a top surface 27 of layer 15) to a top surface 55 of layer 17. Regions 22 and 24 are 350–500 Å thick (from surface 21 to surface 55) and include a source extension 23 and a drain extension 25.

Extensions 23 and 25 are preferably ultra-shallow extensions (e.g., junction depth is less than 30 nanometers (nm)), which are thinner than regions 22 and 24. Extensions 23 and 25 are connected to regions 22 and 24, respectively, and are disposed underneath spacers 32 and partially underneath gate oxide 34. Ultra-shallow extensions 23 and 25 help transistor 12 achieve substantial immunity to short-channel effects. Short-channel effects can degrade performance of transistor 12 as well as the manufacturability of the IC associated with transistor 12. Regions 22 and 24 and hence extensions 23 and 25 have a concentration of $10^{19}$ to $10^{20}$ dopants per cubic centimeter. An appropriate dopant for a P-channel transistor is boron, boron diflouride, or iridium, and an appropriate dopant for a N-type transistor is arsenic, phosphorous, or antimony.

Gate stack or structure 18 includes a pair of spacers 32, gate oxide 34, and a gate conductor 36. Spacers can be silicon nitride ($Si_3N_4$) silicon dioxide ($S_iO_2$) or other insulative material. Gate oxide 34 is preferably thermally grown silicon dioxide on substrate 14 and 15–20 Å thick.

Conductor 36 is preferably deposited by chemical vapor deposition (CVD) and etched to form the particular structure for transistor 12. Spacers 32 are preferably deposited over conductor 36 by CVD and planarized or etched to leave spacers 32 having a width of 100–200 Å. Conductor 36 is preferably a metal such as titanium nitride (TiN), Molybdenum (Mo), Tungsten (W), or other conductor. Gate structure 18 has a height or thickness of 800–1000 Å.

Gate structure 18 is disposed over an ultra-thin body channel region 37. Channel region 37 has a thickness less than 200Å which reduces the susceptibility of transistor 12 to short channel affects such as voltage roll-off and drain-induced barrier lowering. Channel region 37 is located between extensions 23 and 25 and underneath gate oxide 34. Region 37 is as thick as layer 15 associated with substrate 14.

Transistor 12 is disposed between isolation regions 52 in layer 15 of substrate 14. Isolation regions 52 are preferably oxide structures which separate transistor 12 from neighboring transistors. Regions 52 can be formed in a local oxidation of silicon (LOCOS) process, a shallow trench isolation (STI) process, or other insulative structure formation process.

Transistor 12 can be an N-channel or a P-channel field effect transistor, such as, a metal oxide semiconductor field effect transistor (MOSFET). Transistor 12 can be at least partially covered by an insulative layer and is preferably part of an ultra-large scale integrated (ULSI) circuit that includes one million or more transistors. Regions 22 and 24 have a concentration of $5 \times 10^{19} - 1 \times 10^{20}$ dopants per cubic centimeter.

With reference to FIGS. 1–5, the fabrication of transistor 12, including source extension 23 and drain extension 25, on SOI substrate 14, is described below as follows. The advantageous process allows source and drain regions 22 and 24, respectively, to be annealed in a low thermal budget process, which allows regions 22 and 24 to have super abrupt junctions. The low thermal budget reduces the lateral spread of dopants in regions 22 and 24 and thereby reduces susceptibility to short circuits between extension 23 and 25.

Figure 2:
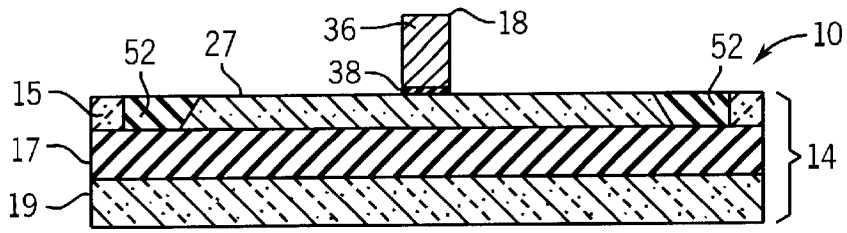
FIG. 2 is a cross-sectional view of the portion of the substrate illustrated in FIG. 1, showing a gate stack formation step.

In FIG. 2, transistor 12 can be substantially formed by conventional semiconductor processing techniques to include gate structure 18. Gate structure 18 is comprised of gate oxide 34, and gate conductor 36. Layer 15 includes insulative structures 52. Gate conductor 36 is 800–1000 Å thick and is configured with a proper work function for transistor 12. Preferably, conductor 18 is a metal conductor so there is no need to use a high-temperature rapid thermal anneal (900–1100° C.) to activate dopants in gate structure 18 (as required in doped polysilicon conductors).

Figure 3:
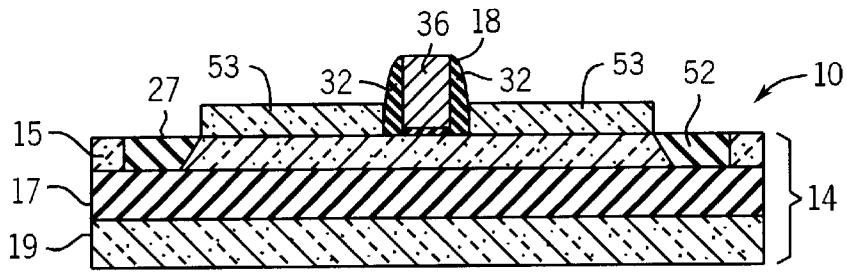
FIG. 3 is a cross-sectional view of the portion of the substrate illustrated in FIG. 2, showing a selective epitaxy step.

In FIG. 3, spacers 32 abut gate structure 18 and are formed in a conventional deposition and etch back process. Spacers 32 are preferably 100–200 Å wide and 800–1000 Å thick. After spacers 32 are formed, portion 10 is subject to a selective semiconductor epitaxy process which provides a layer 53 above top surface 27 of layer 15. Layer 53 is preferably a 200–300 Å thick film of silicon. Layer 53 is preferably the same material as layer 15 (e.g., silicon). Spacers 32 assist the definition of extensions 23 and 25 (FIG. 1).

Figure 4:
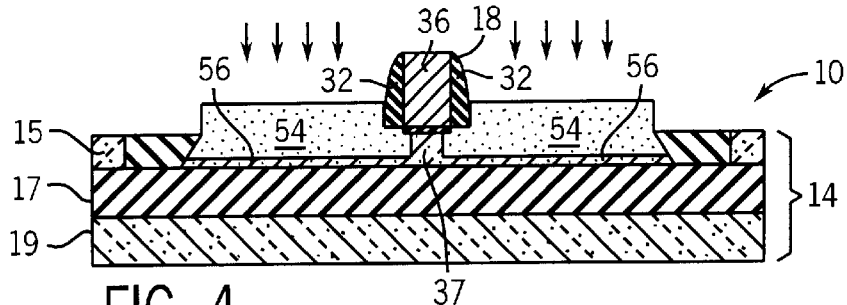
FIG. 4 is a cross-sectional view of the portion of the substrate illustrated in FIG. 3, showing a forming amorphous regions step.

In FIG. 4, after layer 53 is formed, portion 10 is subject to an amorphization implant (e.g., layers 15 and 53 are amorphized). Preferably, portion 10 is subjected to neutral dopants (amorphization implant). For example, layers 53 and 15 can be amorphized by a low energy implant of germanium, xenon, or silicon. The implant can utilize germanium ions having an energy of 5–10 KeV at a dose $2-4 \times 10^{14}$ dopants per centimeter squared.

Figure 5:
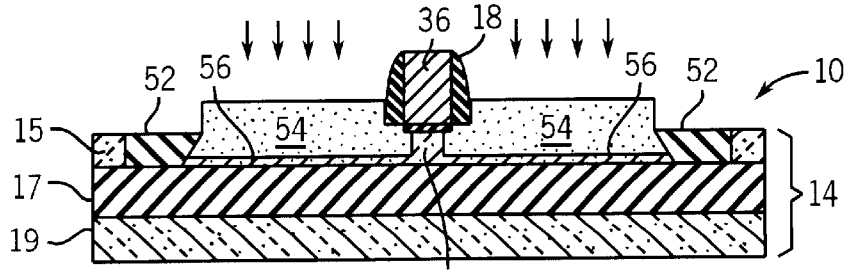
FIG. 5 is a cross-sectional view of the substrate illustrated in FIG. 4, showing a source/drain dopant implant step.

The amorphization implant under low energy creates amorphous region 54 (depicted in FIGS. 4 and 5 as a stippled area). Preferably, the implant energy is controlled so that a thin region 56 remains as crystalline material (e.g., is unamorphized). Layer 56 acts as a seeding layer for subsequent recrystallization of region 54. Region 56 is preferably 100 Å thick. Regions 54 are 250–400 Å thick.

Conductor 36 protects channel region 37 from the amorphization implant. Region 54 does not appreciably extend underneath conductor 36 due to the protective properties of conductor 36. However, region 54 extends underneath spacers 32. Region 54 underneath spacers 32 assists the definition of extensions 23 and 25.

In FIG. 5, after the amorphization implant, portion 10 is subjected to source/drain dopant implants utilizing non-neutral dopants provided to amorphous regions 54. Preferably, a heavy non-neutral dopant such as arsenic (As), antimony (Sb), indium (In), gallium (Ga) can be implanted into regions 54 (source region 22 and drain region 24 in FIG. 5). Preferably, the projection or peak concentration of the dopant is located at a depth of one-half of amorphous region 54 (e.g., 125–200 Å) and leaves a concentration of $5 \times 10^{19}$ dopants per cubic centimeter. The use of a heavy dopant ion implant can reduce the lateral straggle (spread) of the implantation of dopants. Conductor 36 serves to protect channel region 37 from the dopant implant.

In FIG. 1, portion 10 is subject to a low-temperature furnace anneal at 550–650° C. for a time of 5–20 minutes. The furnace anneal can be a low-temperature rapid thermal anneal (RTA). The annealing process recrystallizes region 54 (FIG. 5) to form source region 22 and drain region 24. Dopants inside region 54 (FIG. 5) become electrically activated during the crystal regrowth process. Therefore, source region 22 and drain region 24 are formed under a very low thermal budget process so that lateral thermal diffusion of dopants is negligible. Source and drain extensions 23 and 25 are formed as the main parts of source region and drain region 24 are formed. Preferably, the dopant profile is almost the same as the dopant profile when implanted in FIG. 5. After annealing, conventional SOI MOS fabrication processing can be utilized to formed contacts, interconnects and interlevel dielectrics.

It is understood that while the detailed drawings, specific examples, and particular values given provide a preferred exemplary embodiment of the present invention, the preferred exemplary embodiment is for the purpose of illustration only. The method and apparatus of the invention is not limited to the precise details and conditions disclosed. For example, although germanium ion implantation forms the amorphous region, other techniques can be utilized. Various changes may be made to the details disclosed without departing from the spirit of the invention which is defined by the following claims.

What is claimed is:

1. A method of manufacturing an integrated circuit including a substrate and a plurality of transistors, the plurality of transistors including a first transistor having a gate structure disposed on a film, the film having a thickness of 150–200 Å, the first transistor having a channel thickness of 150–200 Å, the gate structure being located between a pair of isolation structures, the method comprising:

providing the pair of isolation structures in the film, the isolation structures extending from a top surface of the film to a bottom surface of the film;

forming an elevated source region and an elevated drain region on the film by selective silicon epitaxy, wherein silicon material is not provided above the isolation structures, the elevated source region and the elevated drain region being between the pair of isolation structures, the gate structure being between the elevated source region and the elevated drain region;

amorphizing the elevated source region and the elevated drain region and a portion of the film;

providing dopants to the elevated source region and the elevated drain region and the film; and annealing the elevated source region and the elevated drain region to recrystallize the elevated source region and the elevated drain region, wherein a transistor source region extends from a top surface of the elevated source region to the bottom surface of the film and a transistor drain region extends from a top surface of the elevated drain region to the bottom surface of the film.

2. The method of claim 1, wherein the annealing step comprises a low temperature annealing step.

3. The method of claim 2, wherein the annealing step comprises a rapid thermal anneal at a temperature of less than about 650° C. for between 5 and 20 minutes.

4. The method of claim 1, wherein the doping step provides a peak concentration of dopants at a vertical midpoint between the top surface of the elevated source region and the bottom surface of the the film.

5. The method of claim 1, wherein the substrate comprises a silicon-on-insulator substrate.

6. The method of claim 5, wherein the film includes silicon.

7. The method of claim 1, wherein the gate structure protects a channel region during the amorphization step.

8. A method of manufacturing a ULSI circuit on a semiconductor-on-insulator substrate, the substrate including a gate disposed on a thin semiconductor film, the gate being above an ultra-thin channel region, the method comprising:

selectively forming a semiconductor layer by semiconductor epitaxy to form a first structure at a first location on the thin semiconductor film and a second structure at a second location on the thin semiconductor film, the gate being between the first location and the second location;

providing neutral dopants to the first structure and the second structure to form amorphous regions, the amorphous regions extending vertically from the first structure and the second structure and into the thin semiconductor film, the thin semiconductor film having an unamorphized region less than 100 Å thick;

doping the first structure and the second structure with non-neutral dopants; and annealing the substrate to recrystallize the first structure and the second structure and an amorphized portion of the thin semiconductor film, wherein a source region extends from a top surface of the first structure to a bottom surface of the thin semiconductor film and a drain region extends from a top surface of the second structure to a bottom surface of the thin semiconductor film.

9. The method of claim 8, wherein the semiconductor layer is 250–400 Å thick.

10. The method of claim 9, wherein the neutral dopants are silicon, germanium or xenon.

11. The method of claim 10, wherein the annealing step activates the non-neutral dopants.

12. The method of claim 11, wherein the first structure and second structure are a source and a drain, respectively.

13. The method of claim 8, wherein the gate is metal and protects the ultra-thin channel region from the neutral and non-neutral dopants.

14. The method of claim 13, wherein a first spacer and a second spacer abut the gate and a source extension is formed under the first spacer and a drain extension is formed under the second spacer.

15. The method of claim 14, wherein the gate is provided on a top surface of the semiconductor-film and the source extension and the drain extension are below the top surface.

* * * * *